(12) United States Patent
Arase

(10) Patent No.: US 8,414,976 B2
(45) Date of Patent: *Apr. 9, 2013

(54) METHOD FOR DISPOSING A COMPONENT

(75) Inventor: Hidekazu Arase, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/540,237

(22) Filed: Jul. 2, 2012

(65) Prior Publication Data

US 2012/0269971 A1  Oct. 25, 2012

Related U.S. Application Data

(63) Continuation of application No. PCT/JP2012/000011, filed on Jan. 4, 2012.

(30) Foreign Application Priority Data

Apr. 18, 2011  (JP) ................................. 2011-091667

(51) Int. Cl.
| | | |
|---|---|---|
| *H01L 21/52* | (2006.01) | |
| *H01L 21/50* | (2006.01) | |
| *G02F 1/1343* | (2006.01) | |
| *G02F 1/1362* | (2006.01) | |

(52) U.S. Cl.
USPC ............. 427/266; 427/58; 427/162; 427/164; 427/256; 427/258; 427/260; 427/261; 427/264; 427/265; 427/269; 29/829; 29/833; 29/834; 29/825; 29/592.1; 438/106; 438/107

(58) Field of Classification Search .................... None
See application file for complete search history.

(56) References Cited

U.S. PATENT DOCUMENTS

| | | | |
|---|---|---|---|
| 7,730,610 | B2 | 6/2010 | Nakagawa et al. |
| 7,867,563 | B2 | 1/2011 | Arase et al. |
| 2010/0266769 | A1* | 10/2010 | Arase et al. .................. 427/260 |
| 2011/0203731 | A1 | 8/2011 | Arase |
| 2012/0207930 | A1* | 8/2012 | Arase ............................ 427/264 |

FOREIGN PATENT DOCUMENTS

| | | |
|---|---|---|
| JP | 4149507 | 7/2008 |
| JP | 4531862 | 6/2010 |
| WO | WO 2011/043019 A1 | 4/2011 |

OTHER PUBLICATIONS

International Search Report issued in International Patent Application No. PCT/JP2012/000011 dated Mar. 27, 2012.

* cited by examiner

*Primary Examiner* — Nathan Empie
*Assistant Examiner* — Lisha Jiang
(74) *Attorney, Agent, or Firm* — McDermott Will & Emery LLP

(57) ABSTRACT

Provided is a method for disposing a component on a substrate (100), the method comprising steps of: a step (a) of preparing the substrate (100), a first liquid, and a component-dispersing liquid; a step (b) of applying the first liquid to the substrate (100) along the +X direction continuously to dispose the first liquid on hydrophilic lines (112) and hydrophilic body regions (111) along the +X direction alternately; a step (c) of bringing the component-dispersing liquid in contact with the first liquid disposed on the hydrophilic region (111); and a step (d) of removing the first liquid and the second liquid from the substrate (100) to dispose the component on the hydrophilic region (111).

5 Claims, 16 Drawing Sheets

METHOD FOR DISPOSING A COMPONENT

This is a Continuation of International Application No. PCT/JP2012/000011, with an international filing date of Jan. 4, 2012, which claims the foreign priority of Japanese Patent Application No. 2011-091667, filed on Apr. 18, 2011, the entire contents of both of which are hereby incorporated by reference.

The present disclosure relates to a method for disposing a component.

BACKGROUND

Active-type liquid crystal display devices and organic electroluminescence display devices are formed on glass substrates. Pixels that are arranged in a matrix on the substrate are each controlled by a transistor placed in the vicinity of the pixel. With current technologies, however, crystalline semiconductor transistors cannot be formed on a glass substrate. Therefore, thin film transistors formed using amorphous silicon or polysilicon thin films are used for the control of pixels. Such thin film transistors have the advantage that they can be fabricated on a large-area substrate at low cost. The thin film transistors, however, have the disadvantage that lower mobility of the amorphous silicon or polysilicon thin films than crystalline silicon prevents the transistors from operating at high speed. To overcome this disadvantage, a large number of transistors are fabricated on a silicon wafer beforehand and then cut into individual pieces to be disposed on a substrate.

FIGS. 10A-10D show a method disclosed in U.S. Pat. No. 7,730,610. This Patent discloses a preparation of a substrate 10 having a plurality of hydrophilic regions 11 and a water-repellant region 12 which surrounds the hydrophilic regions 11. Next, as shown in FIG. 10B, components 40 to be disposed on the substrate are dispersed in a solvent 30 substantially insoluble in water to prepare component-dispersing liquid 60. FIG. 10B illustrates the component-dispersing liquid 60 in a container 70. One of the surfaces of the component 40 is hydrophilic and is to be bonded to the substrate 10, and the other surfaces of the component 40 are water-repellent.

Next, as shown in FIG. 10C, water 20 is disposed in the plurality of hydrophilic regions 11 with a first squeegee 51. Subsequently, as shown in FIG. 10D, the component-dispersing liquid 60 is applied with a second squeegee 52 to bring the component-dispersing liquid 60 into contact with the water 21 disposed in the hydrophilic regions 11. During this process, the components 40 move into the water 21 disposed in the hydrophilic regions 11. Then, the water 21 and the solvent contained in the component-dispersing liquid 60 are removed so that the components 40 are fixed onto the hydrophilic regions 11. The referential mark 61 indicates the component-dispersing liquid 60 disposed on the hydrophilic region 11.

SUMMARY

The purpose of this disclosure is to provide a method which improves the probability that the component is disposed on the hydrophilic region.

Solution to Problem

The present disclosure is directed to a method for disposing a component on a substrate. The method includes the following steps (a) to (d). The step (a) is for preparing the substrate, a first liquid, and a component-dispersing liquid. The substrate includes a water-repellant region and a plurality of hydrophilic regions. The water-repellant region surrounds the plurality of hydrophilic regions. Each of the hydrophilic regions includes a hydrophilic body region and a hydrophilic line. The hydrophilic lines are arranged parallel to one another.

When Y direction denotes the parallel direction of the hydrophilic line, Z direction denotes the normal line of the substrate, +X direction denotes the direction orthogonal to both of the Y direction and the Z direction, and −X direction denotes the reverse direction of the +X direction, the plurality of hydrophilic regions are arranged along the +X direction and along the Y direction, the hydrophilic line and the hydrophilic body region included in each of the hydrophilic region are arranged along +X direction in this order, the hydrophilic body regions and the hydrophilic lines are arranged along the +X direction alternately.

When D1 denotes the interval along the +X direction between the hydrophilic body region and the hydrophilic line included in each of the hydrophilic region, D2 denotes the length along the Y direction of the hydrophilic body region, D3 denotes the length along the Y direction of the hydrophilic line, D4 denotes the width of the hydrophilic line, and D5 denotes the interval between the two adjacent hydrophilic lines arranged along Y direction, the value of D1/D2 is not less than 0.1 and not more than 1.2, the value of D3 is not less than 5 micrometers, the value of D4 is less than the minimum length of the component, the value of D5 is not less than 10 micrometers.

The first liquid is hydrophilic. The component-dispersing liquid containing the component and a second liquid, the second liquid is insoluble in the first liquid, and the component has a hydrophilic surface.

The step (b) is for applying the first liquid to the substrate along the +X direction continuously to dispose the first liquid on the hydrophilic lines and the hydrophilic body regions along the +X direction alternately.

The step (c) is for bringing the component-dispersing liquid in contact with the first liquid disposed on the hydrophilic region.

The step (d) if for removing the first liquid and the second liquid from the substrate to dispose the component on the hydrophilic region.

The term "dispose" in the present specification may include "mount". An example of the components in the present specification is an electric component.

The method according to the present disclosure improves the probability that the component is disposed on the hydrophilic region.

DESCRIPTION OF EMBODIMENTS

The embodiment of the present disclosure is described below with reference to the drawings. Hatching lines may be omitted to facilitate the comprehension of the present specification.

(Step (a))

In the step (a), a substrate 100, a first liquid 200, and a component-dispersing liquid 600 are prepared.

Figure 1A:
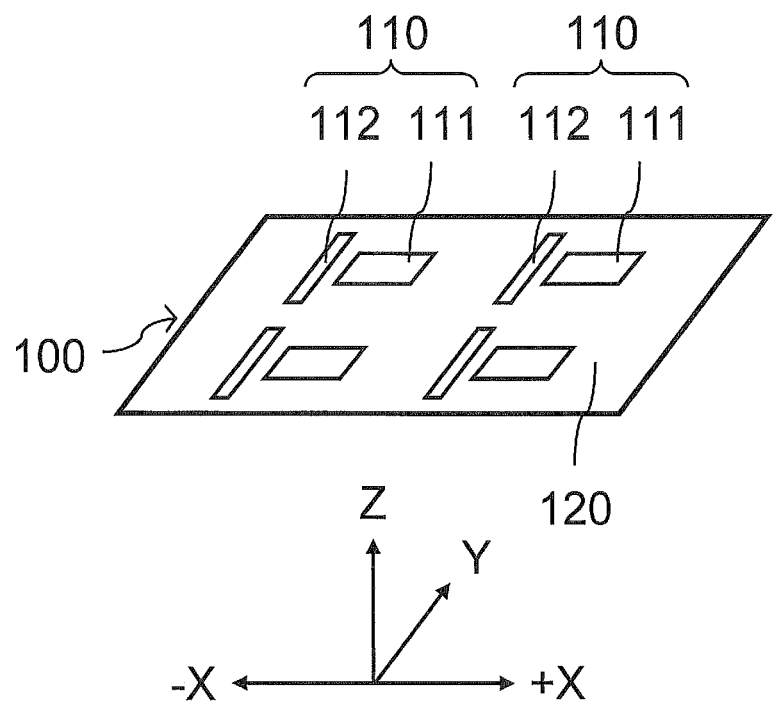
FIG. 1A shows an exemplary substrate 100 having hydrophilic body regions 111, hydrophilic lines 112, and a water-repellant region 120.
Figure 1B:
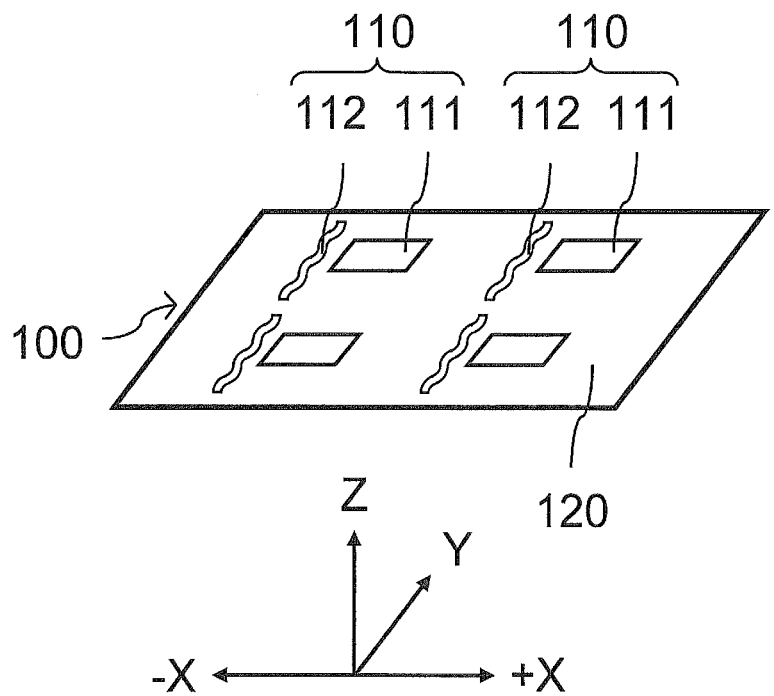
FIG. 1B shows another exemplary substrate 100 having hydrophilic body regions 111, hydrophilic lines 112, and a water-repellant region 120.

FIG. 1A and FIG. 1B show the substrate 100. The substrate 100 has a hydrophilic region 110 and a water-repellant region 120 on its surface.

The water-repellant region 120 surrounds the hydrophilic region 110. The hydrophilic region 110 includes a hydrophilic body region 111 and a hydrophilic line 112.

As shown in FIG. 1A and FIG. 1B, +X direction, -X direction, Y direction, and Z direction are defined. Namely, the Y direction denotes a longitudinal direction of the hydrophilic line 112. The Z direction denotes the normal line of the substrate 100. The +X direction denotes the direction orthogonal to both of the +Y direction and the Z direction. The -X direction denotes the reverse direction of the +X direction. The hydrophilic body region 111 and the hydrophilic line 112 are disposed along the +X direction in this order.

Figure 8:
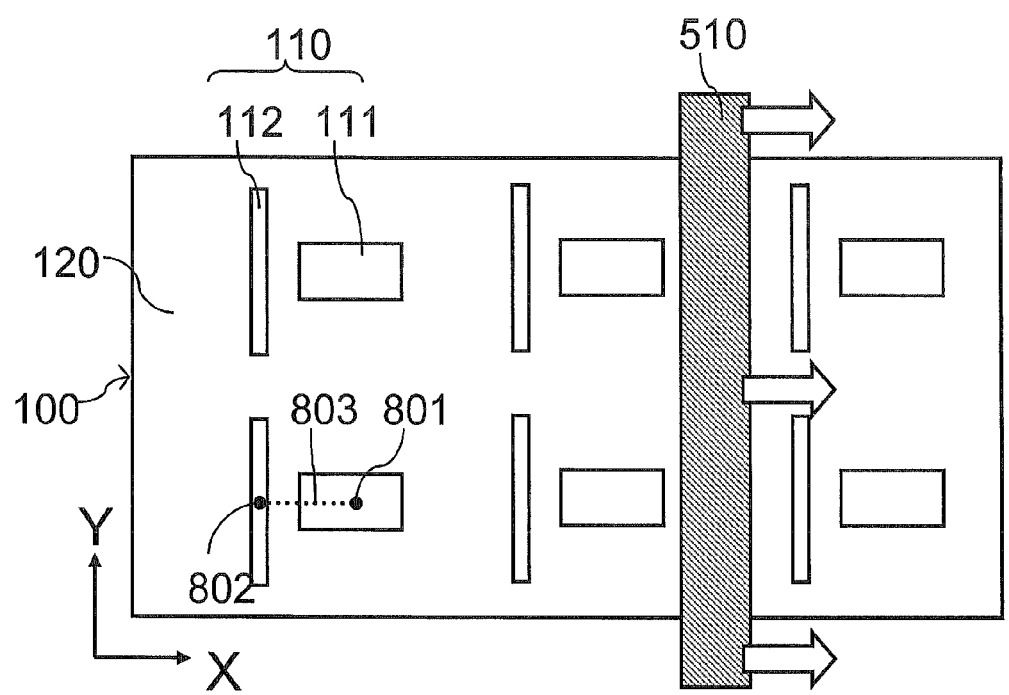
FIG. 8 shows a top view showing how a first squeeze 510 moves on the substrate 100.

In the present embodiment, a plurality of the hydrophilic regions 110 are provided. To be more exact, as shown in FIG. 1A, FIG. 1B, and FIG. 8, four or more hydrophilic regions 110 are provided. To be much more exact, two or more hydrophilic regions 110 are provided along the +X direction, and two or more hydrophilic regions 110 are provided along the Y direction.

Each hydrophilic region 110 includes a hydrophilic body region 111 and a hydrophilic line 112. The hydrophilic line 112 and the hydrophilic body region 111 included in each the hydrophilic region 110 are arranged in this order along the +X direction. Since two or more hydrophilic regions 110 are provided along the +X direction, the hydrophilic body regions 111 and the hydrophilic lines 112 are arranged alternately along the +X direction.

Figure 2A:
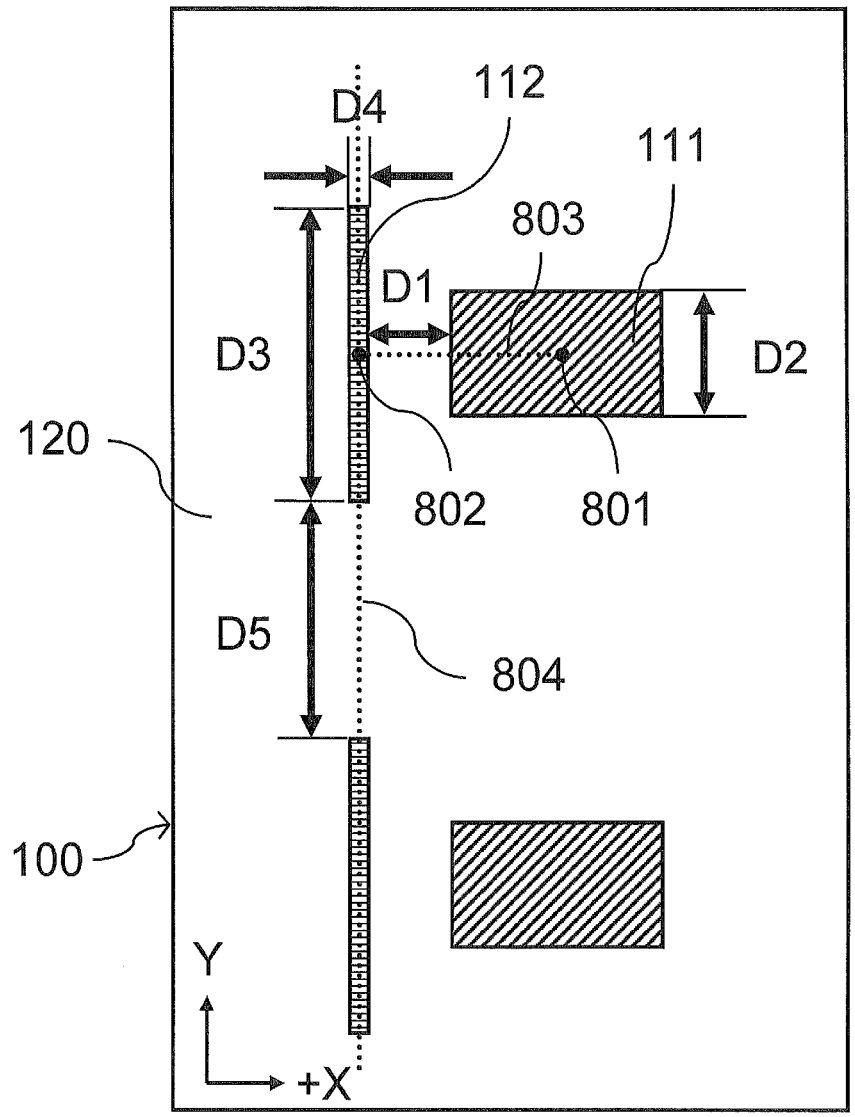
FIG. 2A is a top view for explaining the values of D1 to D5.
Figure 2B:
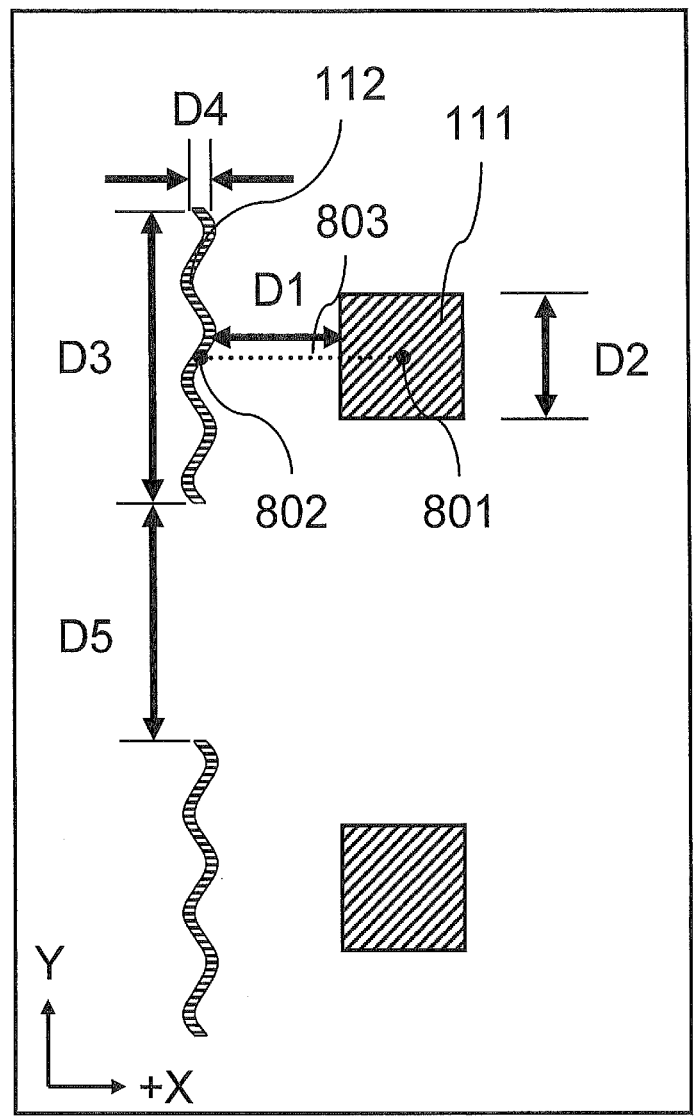
FIG. 2B is a top view for explaining the values of D1 to D4.
Figure 3A:
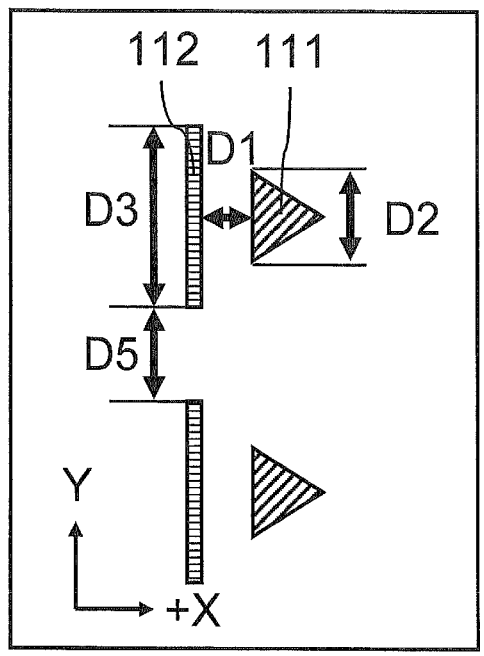
FIG. 3A is a top view for explaining the values of D1 to D4.
Figure 3B:
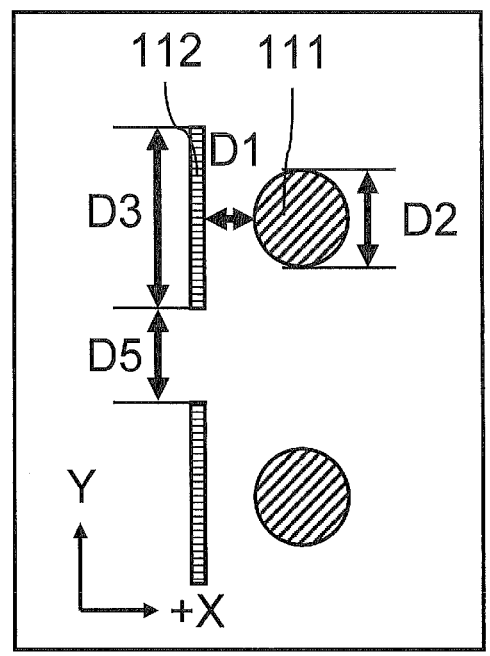
FIG. 3B is a top view for explaining the values of D1 to D4.
Figure 3C:
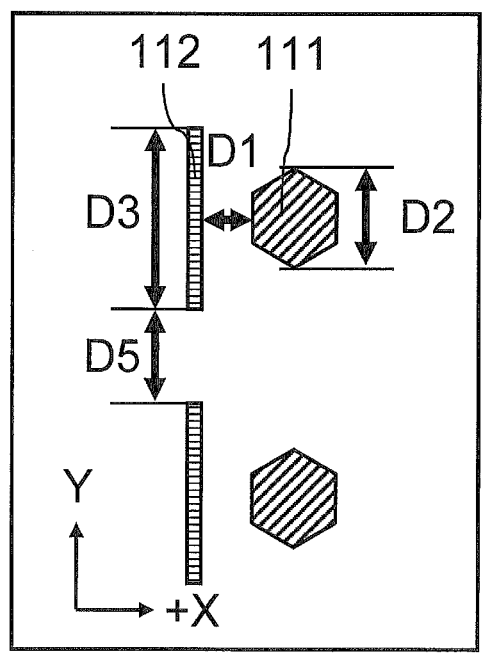
FIG. 3C is a top view for explaining the values of D1 to D4.

The hydrophilic lines 112 are arranged parallel to one another. As shown in FIG. 2A, the hydrophilic lines 112 included in the plurality of the hydrophilic regions 110 adjacent along the Y direction are aligned in one imaginary line 804 parallel to the Y direction.

The wettability of the hydrophilic body region 111 and the hydrophilic line 112 to water is higher than that of the water-repellant region 120.

Next, the values of D1-D5 are described.

(D1)

As shown in FIGS. 2A-3C, D1 represents the interval between one hydrophilic body region 111 and adjacent one hydrophilic line 112 along the +X direction. To be exact, as shown in FIG. 2A and FIG. 2B, D1 means the interval between the hydrophilic body region 111 and the hydrophilic line 112 along the imaginary line 803 shown in FIG. 2A and FIG. 2B. The imaginary line 803 connects the center point 801 of the hydrophilic body region 111 with the center point 802 of the hydrophilic line 112.

(D2, D3)

As shown in FIGS. 2A-3C, D2 represents the length along the Y direction of the hydrophilic body region 111. D3 represents the length along the Y direction of the hydrophilic line 112.

(Value of D1/D2)

The present inventors discovered that it is necessary that the value of D1/D2 falls within a range of not less than 0.1 and not more than 1.2. When the value of D1/D2 is less than 0.1, the probability that the components 400 are disposed on the hydrophilic body regions 111 may be lowered (see the comparative example 1, which is described later). In other words, the value of (the number Np of the hydrophilic body regions 111 where the components 400 are disposed)/(the number of the hydrophilic body regions 111) is smaller, which means low efficiency. Similarly, when the value of D1/D2 is more than 1.2, the probability that the components 400 are disposed on the hydrophilic body regions 111 may be lowered (see the comparative examples 2-4, which are described later).

(Value of D3)

The present inventors discovered that it is necessary that the value of D3 is not less than 5 micrometers. When the value of D3 is less than 5 micrometers, the probability that the components 400 are disposed on the hydrophilic body regions 111 may be lowered (see the comparative examples 6-9, which are described later). It is preferred that the value of D3 is not more than 1000 micrometers.

(Value of D4)

It is necessary that the value of D4, which represents the width of the hydrophilic line 112, is smaller than the minimum length of the component 400. When the D4 is equal or larger than minimum length of the component 400, the component 400 may be disposed on the hydrophilic line 112. Preferably, the value of D4 is less than half of the minimum length of the component 400.

Here, the "minimum length of the component 400" will be described in more detail with reference to FIG. 5A to FIG. 5D.

Figure 5A:
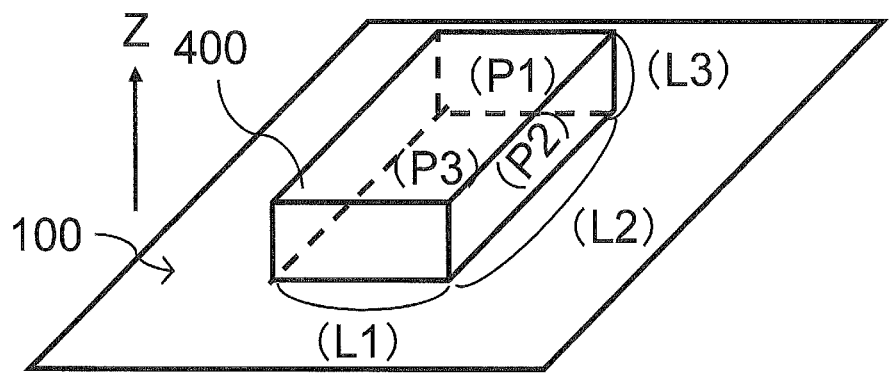
FIG. 5A is a perspective view for explaining the minimum length of the component.

When the component 400 is a rectangular parallelepiped having a pair of surfaces (P1), a pair of surfaces (P2) each having an area equal to or larger than the surface (P1), and a pair of surfaces (P3) each having a larger area than the surface (P2), as shown in FIG. 5A, the lengths of the sides of the rectangular parallelepiped are denoted as (L1), (L2), and (L3) respectively. When the shape and size of the hydrophilic body region 111 is the same as those of the surface (P3), the component 400 is disposed so that the one of the surfaces (P3) faces the surface of the substrate 100 on which the hydrophilic body region 111 is provided. In this case, the "minimum length of the component 400" refers to the length (L1) of the shortest side among the lengths (L1) and (L2) of the sides that form the mounting surface (P3) to be brought into contact with the substrate. What "the same/identical shape and size" means in this specification will be described later.

Figure 5B:
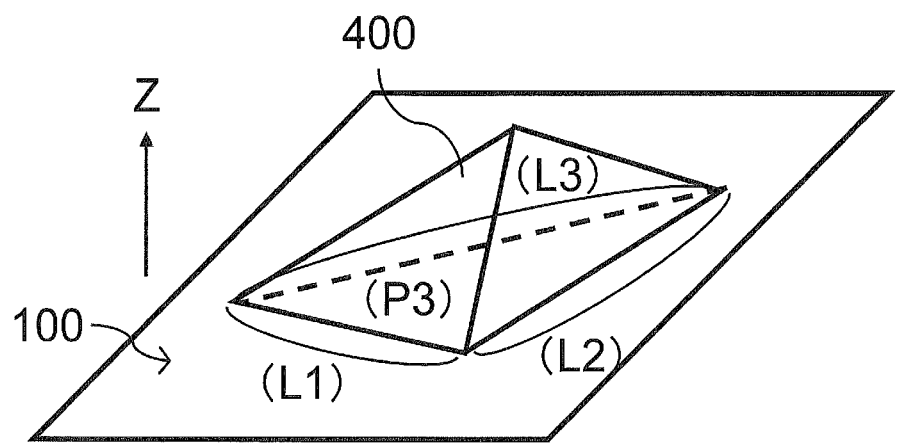
FIG. 5B is a perspective view for explaining the minimum length of the component.

When the surface (P3) of the component 400 to be disposed to face the hydrophilic body region 111 of the substrate 100 has a triangular shape, as shown in FIG. 5B, the "minimum length of the component 400 to be mounted" refers to the length (L1) of the shortest side among the lengths (L1), (L2), and (L3) of the sides that form the triangle.

Figure 5C:
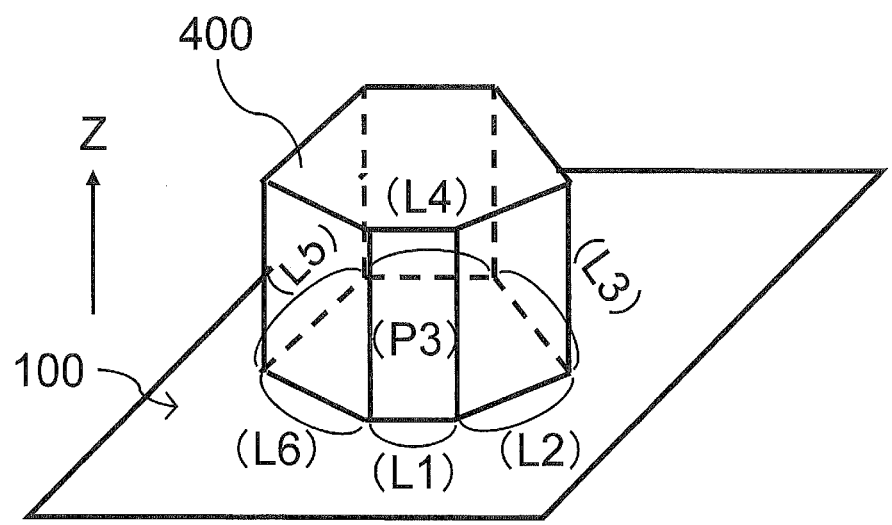
FIG. 5C is a perspective view for explaining the minimum length of the component.

When the surface (P3) of the component 400 to be disposed to face the hydrophilic body region 111 of the substrate 100 has a hexagonal shape, as shown in FIG. 5C, the "minimum length of the component 400" refers to the length (L1) of the shortest side among the lengths (L1) to (L6) of the sides that form the hexagon.

Figure 5D:
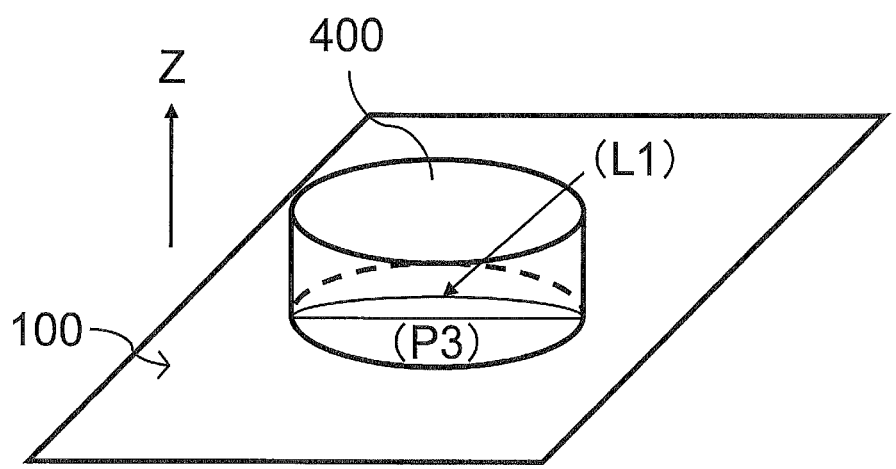
FIG. 5D is a perspective view for explaining the minimum length of the component.

When the surface (P3) of the component 400 to be disposed to face the hydrophilic body region 111 of the substrate 100 has a circular shape, as shown in FIG. 5D, the "minimum length of the component 400" refers to the length (L1) of the diameter of the surface (P3). In the case of an ellipse, it means the shorter diameter.

Preferably, the minimum length of the component 400 to be mounted is at least 10 μm. When the component 400 is a rectangular parallelepiped comprising the surfaces (P1), the surfaces (P2), and the surfaces (P3), the long side (the side having the length (L2) in FIG. 5A) of the mounting surface (P3) to be brought into contact with the substrate preferably has a length of 1000 micrometers or less.

(Value of D5)

As shown in FIGS. 2A-3C, D5 represents the interval between two adjacent hydrophilic lines 112 arranged along the +Y direction. The present inventors discovered that it is necessary that the value of D5 is 10 micrometers or more. When the value of D5 is less than 10 micrometers, the probability that the components 400 are disposed on the hydrophilic body regions 111 may be lowered (see the comparative example 11, which is described later). As shown in FIG. 2A, the plurality of the hydrophilic lines 112 are arranged in such a manner that the plurality of the hydrophilic lines 112 are aligned in an imaginary line 804 depicted parallel to the Y direction.

In the step (a), the first liquid is prepared. The first liquid is described later in more detail together with the second liquid.

Figure 4:
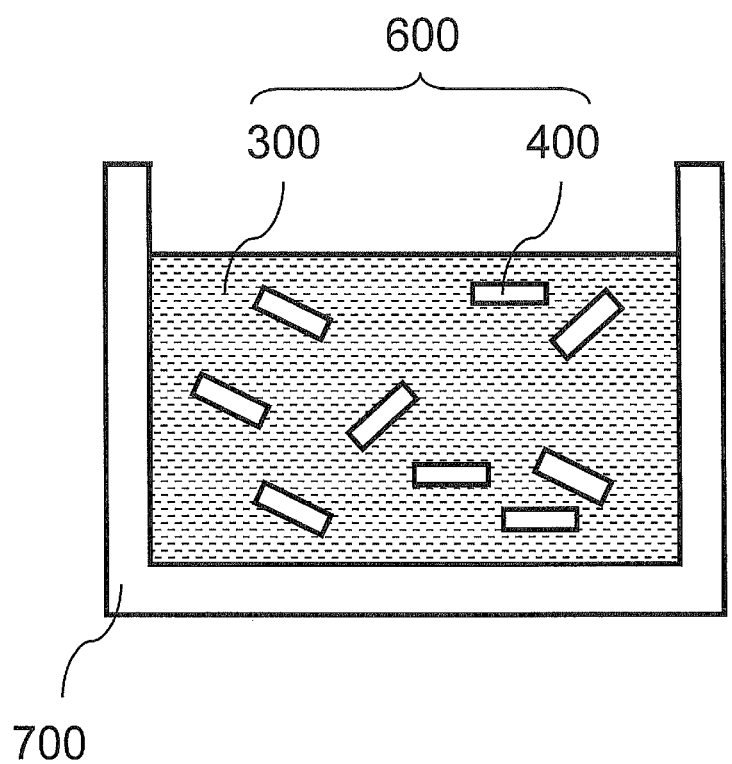
FIG. 4 shows a schematic illustration of a component-dispersing liquid 600 containing components 400.

In the step (a), the component-dispersing liquid is also prepared. The component-dispersing liquid contains the component 400 and a second liquid 300. FIG. 4 is a cross-sectional view schematically showing the component-dispersing liquid. FIG. 4 illustrates a component-dispersing liquid 600 in a container 700. The component-dispersing liquid 600 contains a second liquid 300 and the components 400 dispersed in the second liquid 300. Water is substantially insoluble in the second liquid 300. An example of the second liquid 300 is hexane. Other examples of the second liquid 300 will be described later. As used in this specification, the term "dispersed" refers to a state in which the components 400 do not agglomerate in the second liquid 300. The component-dispersing liquid 600 may be stirred to disperse the components 400 therein.

The first liquid 200 and the second liquid 300 may be selected appropriately in consideration of the interfacial tension that acts on the interface between the first liquid 200 and the second liquid 300 and the respective degrees of wettability of the first liquid 200 and the second liquid 300 with respect to the surface of the component 400.

The first liquid 200 is required to be substantially insoluble in the second liquid 300. Because the first liquid 200 is substantially insoluble in the second liquid 300, the first liquid 200 stays stably in the component-disposing region 111 when the second liquid 300 comes in contact with the first liquid 200. And the resulting interfacial tension allows the component 400 to move into the first liquid 200. The phrase "substantially insoluble" means that the solubility defined by the weight of the first liquid dissolved in 100 ml of the second liquid is 10 gram or less, and more preferably 1 gram or less.

A combination of the first liquid 200 and the second liquid 300 is, for example, a combination of a liquid with higher polarity as the first liquid 200 and a liquid with lower polarity than that of the first liquid 200 as the second liquid 300. For example, the first liquid 200 is hydrophilic, and the second liquid 300 is hydrophobic.

An example of the first liquid 200 is water. Instead of water, alcohols such as methanol, ethanol, ethylene glycol, and glycerine, and a mixture of such an alcohol and water can be used. Water is more suitable because it has a high surface tension and therefore enables the component 400 to be held firmly in the component-disposing region 111.

Examples of the second liquid 300 are:

alkanes such as hexane, heptane, octane, nonane, decane, undecane, dodecane, tridecane, tetradecane, pentadecane, and hexadecane;

aromatic hydrocarbons such as toluene, benzene, and xylene;

chlorinated solvents such as chloromethane, dichloromethane, chloroform, carbon tetrachloride, monochlorobutane, dichlorobutane, monochloropentane, and dichloropentane;

ethers such as diethyl ether, and petroleum ether;

esters such as ethyl acetate, and butyl acetate;

silicone oil;

perfluorooctane;

perfluorononane; or mixtures of these.

It is preferable that the second liquid 300 is a chlorinated solvent.

The material of the substrate 100 is not limited. A substrate formed of an inorganic material, a polymeric resin material, or a composite of an inorganic material and a polymeric resin material may be used. The inorganic material includes ceramics such as alumina, silicon, and glass. The polymeric resin material includes polyimide resin, polyamide resin, epoxy resin, and polycarbonate resin. The composite of an inorganic material and a polymeric resin material is, for example, a composite material containing fibers made of glass, ceramic or metal, and a polymeric resin material. An SOI (Silicon On Insulator) substrate or a compound semiconductor substrate also may also be used.

The component 400 and the component-dispersing liquid 600 can be prepared by a known method. U.S. Pat. No. 7,730, 610, incorporated herein by reference, discloses such a known method.

When a high-polarity liquid such as water is used as the first liquid 200, it is preferable that the component 400 has a higher surface energy. Particularly, the surface energy is 40 mJ/m$^2$ or more.

When the surface energy of the component 400 is initially low, it is preferable to treat the surface of the component 400 to increase its surface energy. When the component 400 has silicon on its surface, the surface may be irradiated with ultraviolet light in an ozone atmosphere to increase the surface energy.

A thin film having an affinity for the first liquid 200 may be formed on the surface of the component 400 to increase the surface energy of the component 400. When the first liquid 200 is water, an example of the thin film is a hydrophilic film.

For example, a hydrophilic film of silicon oxide, silicon nitride, or titanium oxide may be formed on the surface of the component 400 by a vacuum sputtering method or a thermal CVD method. After the formation of the hydrophilic film, the surface of the component 400 can be irradiated with ultraviolet light in an ozone atmosphere. The surface of the component 400 can be modified with a silane coupling agent having an amino group, a carboxyl group, or a hydroxyl group at the terminal position to increase the surface energy of the component 400. When the surface of the component 400 has a metal, the surface can be modified with a thiol having an amino group, a carboxyl group, or a hydroxyl group at the terminal position.

As shown in FIG. 1A and FIG. 1B, the hydrophilic line 112 may have a shape of a straight line or may have a shape of a curved line.

The shape of the hydrophilic body region 111 is determined according to the shape of the component 400 to be disposed on the hydrophilic body region 111. The shape of hydrophilic body region 111 includes, for example, a polygonal shape such as a triangle, a quadrangle, or a hexagon, or a circular or elliptical shape. The hydrophilic body region 111 preferably has the same shape as a predetermined surface of the component 400 to be disposed (the surface that faces the substrate when disposed on the substrate). The phrase "having the same shape" means that the shape of the predetermined surface of the component 400 to be disposed (that faces the substrate when disposed on the substrate) and the shape of the hydrophilic body region 111 are in a congruent or similar relationship in a mathematical sense.

S1 denotes the area of the surface of the component 400 which faces the substrate when disposed on the substrate. S2 denotes the area of one hydrophilic body region area 111. The value of S2/S1 is preferably not less than 0.64 and not more than 1.44. When the value of S2/S1 is smaller than 0.64, the hydrophilic body region 111 holds a significantly small amount of water, which reduces the probability of disposing the component 400 therein. When the value of S2/S1 is greater than 1.44, the hydrophilic body region 111 holds significantly excess water. This causes a plurality of components 400 to be disposed in one hydrophilic body region 111.

The hydrophilic body region 111, the hydrophilic line 112, and the water-repellant region 120 can be prepared by selectively forming a water-repellant film on a hydrophilic substrate, for example, by photolithography. One example of the method of forming the hydrophilic body region 111, the hydrophilic line 112, and the water-repellant region 120 is the method disclosed in paragraphs [0049]-[0051] of WO 2010/058516, which corresponds to the U.S. patent application Ser. No. 12/827,255, which is incorporated herein by reference.

In embodiment 1, it is preferred that the hydrophilic body region 111 has an identical surface energy to that of the hydrophilic line 112. However, as long as the surface energy in the water-repellant region 120 is lower than both of the surface energy of the hydrophilic body region 111 and the surface energy of the hydrophilic line 112, the hydrophilic body region 111 may have a different surface energy from that of the hydrophilic line 112.

The wettability of a solid surface with respect to water is related not only to the surface energy of the solid but also the surface tension of the water. The specific value of the surface energy of the hydrophilic solid is preferably not less than 40 mJ/m$^2$. It is more preferable that it is not less than 60 mJ/m$^2$ and not more than 100 m J/m$^2$. The specific value of the surface energy of the water-repellant solid is preferably not less than 5 mJ/m$^2$ and less than 40 mJ/m$^2$. It is more preferable that it is not less than 5 mJ/m$^2$ and not more than 25 mJ/m$^2$.

(Step (b))

In the step (b), as shown in FIGS. 6A-6C and FIG. 7, the hydrophilic first liquid 200 is applied continuously to the substrate 100 along the +X direction. In this manner, the first liquid 200 is disposed on the hydrophilic line 112 and the hydrophilic body region 111 alternately. First, the first liquid 200 is disposed on the hydrophilic line 112 and then, the first liquid 200 is disposed on the hydrophilic body region 111. The reference numeral 211 indicates the first liquid 200 disposed on the hydrophilic body region 111. The reference numeral 212 indicates the first liquid 200 disposed on the hydrophilic line 112. Particularly, a first squeeze 510 is used to apply the hydrophilic first liquid 200. The first squeeze 510 moves along the +X direction Since the water-repellant region 120 surrounds the hydrophilic body region 111 and the hydrophilic line 112, the hydrophilic first liquid 200 (for example, water) disposed on the hydrophilic body region 111 and hydrophilic line 112 in the step (b) is not run over.

Here, the step (b) is described in more detail.

Figure 6A:
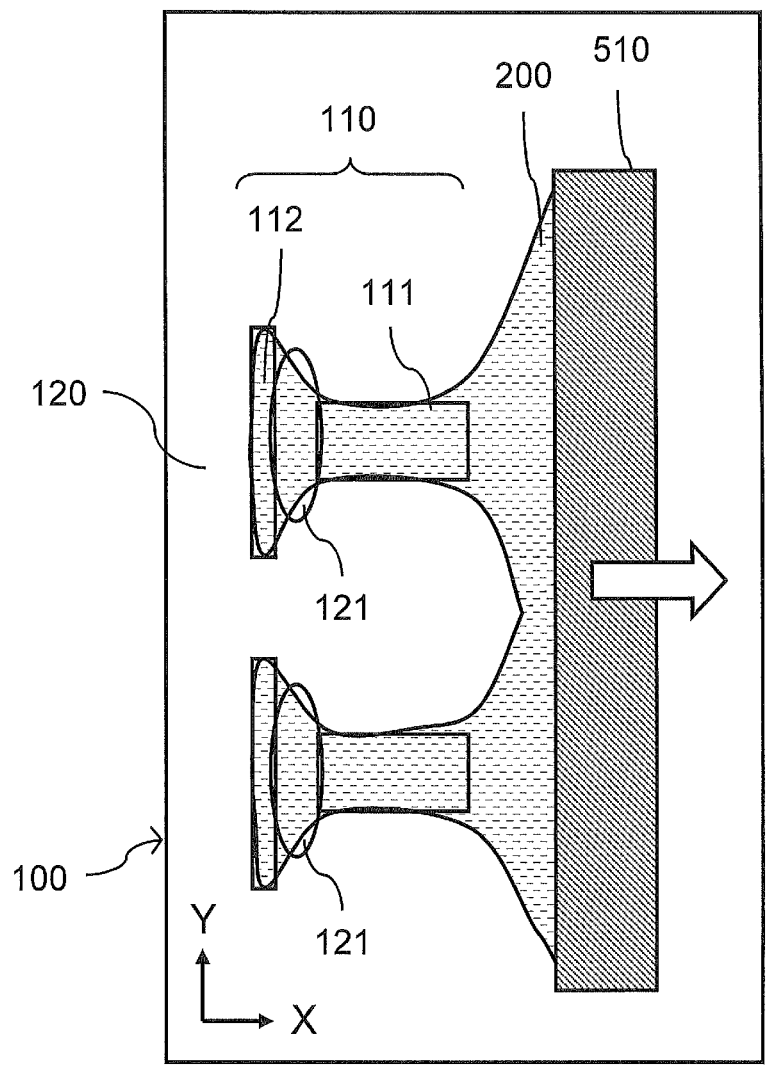
FIGS. 6A-6C show how first liquid 200 applied on the water-repellant region 121 moves on the substrate 100.
Figure 6B:
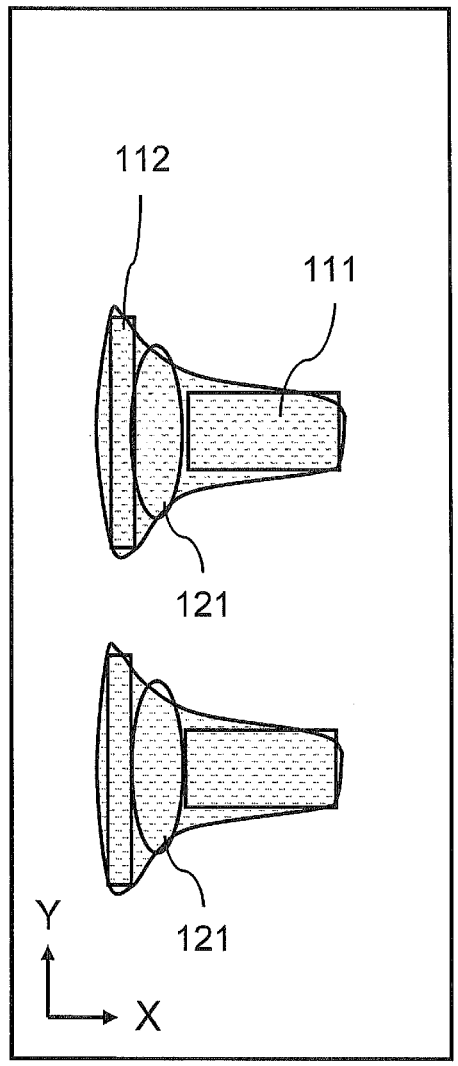
Figure 6C:
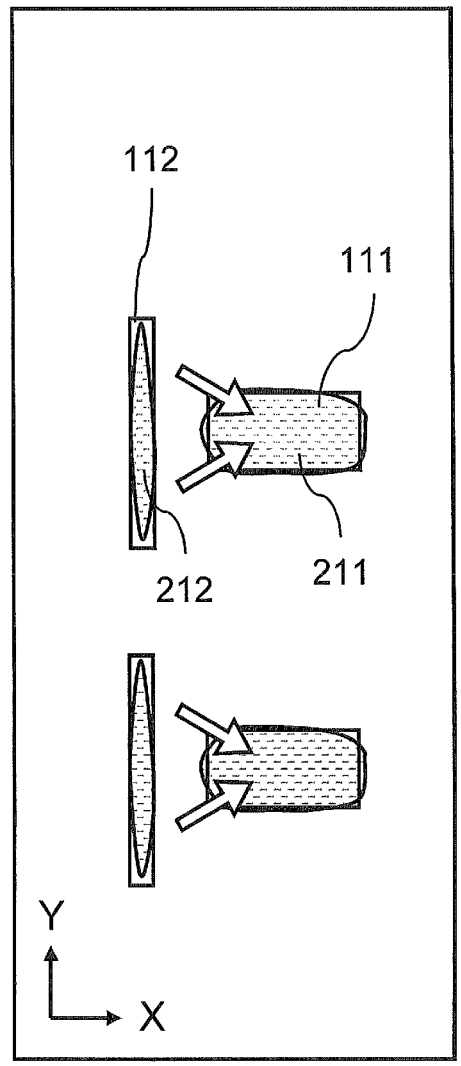

FIGS. 6A-6C are top views showing the step (b) schematically. As shown in FIG. 6A, the first squeeze 510 moves from the one end side of the substrate 100 (the left side in FIG. 6A) to the other end side of the surface 100 (the right side in FIG. 6A). During this process, water is disposed on both of the hydrophilic body region 111 and the hydrophilic line 112. Additionally, water is disposed temporarily a water-repellant region 121 interposed between the hydrophilic body region 111 and the hydrophilic line 112, since the water is applied continuously to the substrate 100. The water-repellant region 121 is the region surrounded by a circle in FIG. 6A. After that, as shown in FIG. 6B and FIG. 6C, the water disposed on the water-repellant region 121 moves and the water is disposed on the hydrophilic body region 111. The lower wettability of the water-repellant region 121 to the water causes the movement of the water. The arrow in FIG. 6C indicates schematically the movement direction of the water.

As a result, the volume of the water disposed on the hydrophilic body region 111 can be increased. The increase of the volume of the water disposed on the hydrophilic body region 111 improves the probability that the component 400 is disposed on the hydrophilic body region 111.

As is clear from the above-mentioned description, since the first liquid 200 (water) is disposed temporarily on the water-repellant region 121, it is necessary that the first liquid 200 (water) be applied continuously to the surface of the substrate 100.

On the contrary, as shown in FIGS. 10A to 10D, when a substrate 10 is used where the hydrophilic line 112 is not formed, the first liquid (water) is applied on the water-repellant region 12. However, the probability that the component is disposed on the hydrophilic region 11 is lower than that of the present embodiment (see the comparative example 6, which is described later).

(Step (c))

Next, the step (c) is described.

Figure 7A:
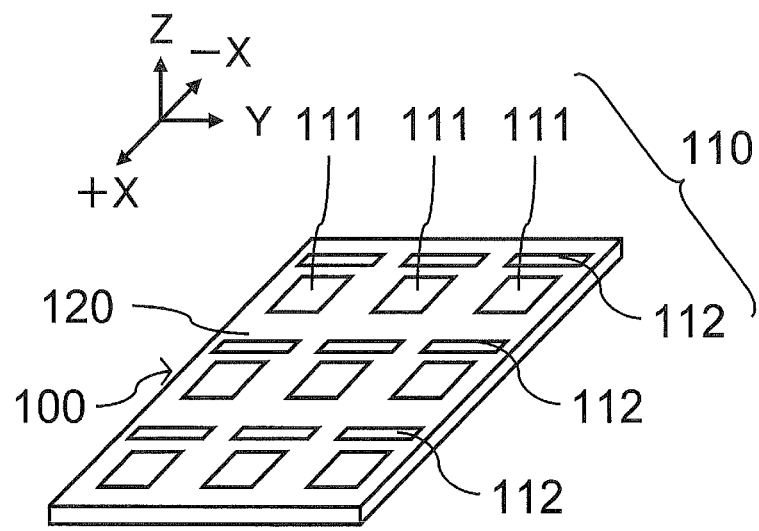
FIG. 7A shows the substrate 100 before the components 400 are disposed.
Figure 7B:
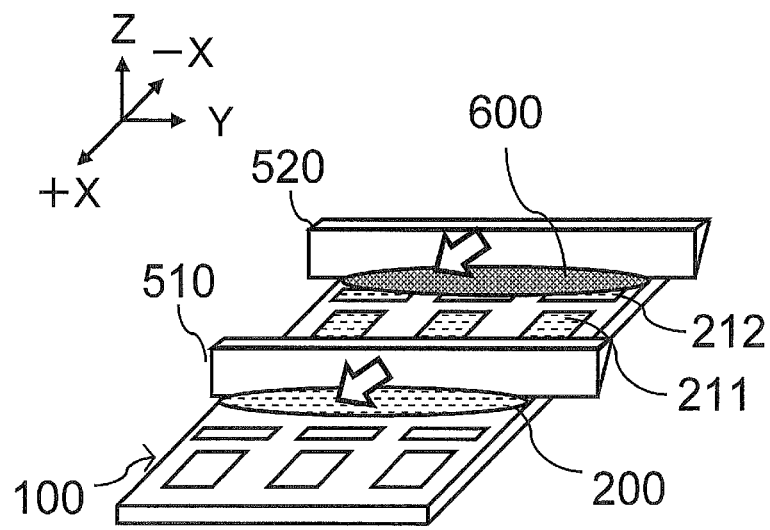
FIG. 7B shows the step of applying the first liquid to the substrate.

FIG. 7B shows the configuration and operation of a mounting apparatus for carrying out the mounting method of the present disclosure. As shown in FIG. 7B, in the mounting apparatus includes the first squeegee 510 and a second squeegee 520. In the step (b), the substrate is exposed to the first liquid 200 with the first squeeze 510 to dispose the first liquid 212 and 211 on the hydrophilic line 112 and the hydrophilic body region 111, respectively.

Figure 7C:
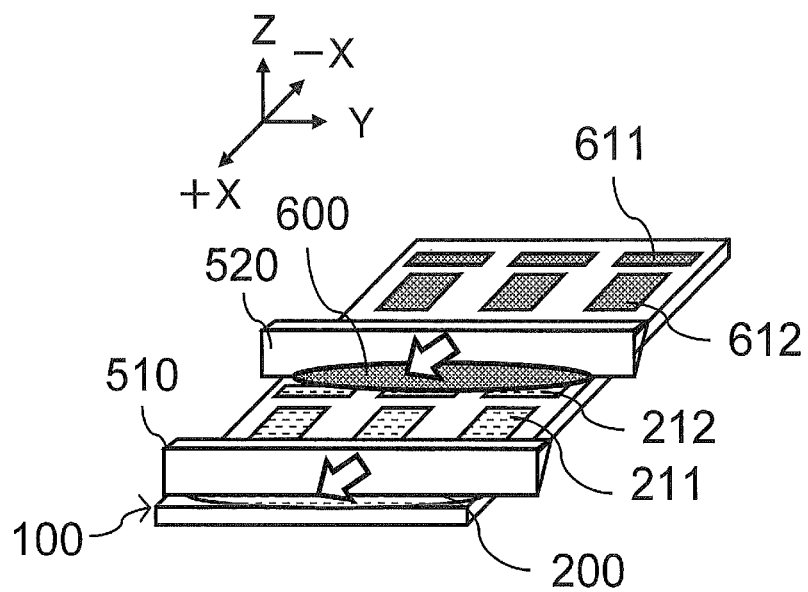
FIG. 7C shows the step of bringing the component-containing liquid into contact with the first liquid.

Then, in the step (c), the component-dispersing liquid 600 is brought into contact with the first liquid 211 disposed on the hydrophilic body region 111. As shown in FIG. 7B and FIG. 7C, the substrate 100 is exposed to the component-dispersing liquid 600 with the second squeeze 520. Preferably, the first squeeze 510 and the second squeeze 520 move along the +X direction on the substrate 100 with the distance maintained therebetween. Means for fixing and moving the squeegees 510 and 520 are not shown in the diagrams. Instead of the use of the second squeeze 520, the substrate 100 may be immersed in the component-dispersing liquid 600 to expose the substrate 100 to the component-dispersing liquid 600 after the step (b).

Since the first liquid 200 (water) is substantially insoluble in the second liquid 300, the first liquids (water) 211-212 stay stably on the hydrophilic body region 111 and the hydrophilic line 112. During this process, the components 400 move into the water 211 disposed on the hydrophilic body regions 111 by the interfacial tension that acts on the components 400. Alternatively, the component 400 moves to the interface formed by the second liquid 300 and water 211. The reference numeral 612 indicates the component-dispersing liquid 600 disposed on the hydrophilic body region 111. The reference numeral 611 indicates the component-dispersing liquid 600 disposed on the hydrophilic line 112.

In FIG. 7B and FIG. 7C, the first squeeze 510 and the second squeeze 520 move along the +X direction and the substrate 100 is not moved. However, the first squeeze 510 and the second squeeze 520 may not be moved and the substrate 100 may move along the −X direction. Alternatively, the first squeeze 510 and the second squeeze 520 move along the +X direction and the substrate 100 moves along the −X direction. In the step (b), the first liquid 200 may be disposed at one edge of the substrate 100. Subsequently, the substrate 100 may be titled to dispose the first liquid 200 on the hydrophilic line 112 and the hydrophilic body region 111 in this order.

(Step (d))

Finally, the step (d) is described.

Figure 7D:
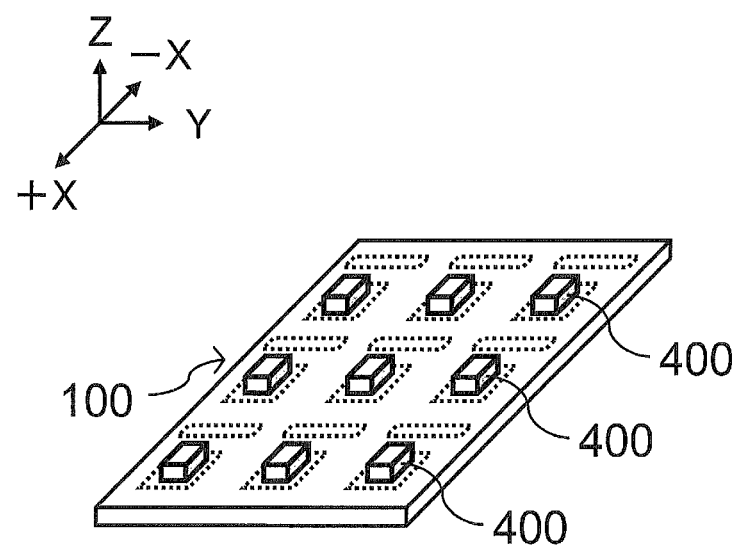
FIG. 7D shows the substrate after the components 400 are disposed.

The first liquid (water) 211-212 and the second liquid 300 are removed from the substrate 100 to dispose the component to the hydrophilic body region 111, as shown in FIG. 7D.

The water 211-212 and the second liquid 300 are removed by a known drying method. A suitable drying method can be selected from well-known drying methods such as natural drying, drying in a vacuum desiccator, drying by blowing air or gas, or drying by heating and/or under reduced pressure. Before drying, the substrate 100 may be washed.

EXAMPLES

The following examples describe the disposing method according to the present subject matter in more detail.

Example 1

In example 1, silicon oxide plates were disposed on the substrate with use of the disposing method according to the present disclosure.

<Preparation of the Substrate>

First, a plurality of the hydrophilic body regions 111 and a plurality of the hydrophilic lines 112 which were surrounded by the water-repellant region 120 were formed on the substrate 100 consisted of silicon as described below.

The substrate 100 consisted of silicon with a thickness of 525 micrometers and with a diameter of 4 inches was subjected to plasma treatment in an atmosphere of oxygen to oxidize the surface of the substrate 100. In this manner, the entire surface of the substrate became hydrophilic. Subsequently, a positive resist pattern corresponding to the hydrophilic body regions 111 and the hydrophilic lines 112 was formed by photolithography.

In a dry atmosphere, the substrate 100 with the resist pattern was immersed for twenty minutes in a perfluorooctane solution containing $CF_3(CF_2)_7C_2H_4SiCl_3$ (hereinafter, referred to as "FS-17") at a concentration of 1 vol %. Subsequently, the substrate 100 was washed in pure perfluorooctane, and then the solvent was removed. Furthermore, the resist pattern was removed with acetone.

Thus, the hydrophilic body regions 111 and the hydrophilic lines 112 which were surrounded by the water-repellant region 120 were formed on the substrate 100.

The hydrophilic body regions 111 formed in example 1 are described below in more detail.

Shape: Rectangular (See FIG. 2A)
Width along the X direction: 40 micrometers
Length along the Y direction (D2): 20 micrometers
The interval between two adjacent hydrophilic body regions 111 along the X direction: 120 micrometers
The interval between two adjacent hydrophilic body regions 111 along the Y direction: 120 micrometers The hydrophilic lines 112 formed in the example 1 are described below in more detail.

Shape: Rectangular (See FIG. 2A)
Width along the X direction (D4): 5 micrometers
Length along the Y direction (D3): 20 micrometers
D1: 2 micrometers
D5: 100 micrometers The component-dispersing liquid 600 containing the silicon oxide plates was prepared in accordance with the following method.

First, an aluminum film having a thickness of 100 nanometers was formed by an electron beam deposition method on the surface of a silicon substrate having a thickness of 525 micrometers. Subsequently, a silicon oxide film was formed with a thickness of 200 nanometers by plasma CVD.

A part of the silicon oxide film was removed by dry-etching using a resist pattern as a mask. The resist pattern was removed by oxygen plasma ashing treatment to form a plurality of the silicon oxide plates. Each of the silicon oxide plates was 20 micrometers long, 40 micrometers wide, and 0.2 micrometers thick. Subsequently, the aluminum film was etched with a mixture of phosphoric acid and nitric acid (hereinafter, referred to as "hot phosphoric acid") at a temperature of 50 degrees Celsius to lift-off the silicon oxide plates.

Next, the silicon oxide plates dispersed in the hot phosphoric acid were suction-filtered with use of a filter. The filter where the silicon oxide plates were attached was dried in a dried atmosphere overnight. Subsequently, the filter was immersed for two hours in a 1,4-dichlorobutane solution containing 1-chloroethyl-trichlorosilane at a concentration of 1 vol %. The silicon oxide plates were dispersed in the solution. The silicon oxide plates were suction-filtered with use of a filter in a dried nitrogen atmosphere. The unreacted 1-chloroethyltrichlorosilane was removed by washing to obtain the silicon oxide plates each having a chemically-modified surface on the filter. The filter was immersed in the 1,4-dichlorobutane and applied by ultrasonic wave. The application of the ultrasonic wave causes the silicon oxide plates attached to the filter to be dispersed in 1,4-dichlorobutane. Thus, the component-dispersing liquid was prepared.

<Squeeze>

The bottom surface of the first squeeze had a slit which was 20 millimeters long and 0.5 millimeters wide. In order to hold water stably, an absorbent cotton containing water was provided in the slit.

The second squeeze 520 was a knife made of polyethylene.

As shown in FIG. 7B, the first squeeze 510 and the second squeeze 520 were disposed at the side of one end of the substrate. The component-dispersing liquid 600 having a volume of 50 microliters was disposed with a glass pipette in front of the second squeeze 520.

The interval between the bottom surface of the first squeeze 510 and the substrate 110 was maintained at approximately 0.2 millimeters.

The interval between the bottom surface of the second squeeze 520 and the substrate 110 was maintained at approximately 0.2 millimeters.

The interval between the first squeeze 510 and the second squeeze 520 was maintained at 1 millimeter.

Subsequently, the first squeeze 510 and the second squeeze 520 were moved along the +X direction at a rate of 10 millimeters/second. This operation was repeated ten times.

The disposition condition of the silicon oxide plates on the substrate 100 was observed with a microscope. Particularly, forty-two hydrophilic body regions 111 were selected. Out of the selected forty-two hydrophilic body regions 111, the number (Np) of the hydrophilic body regions 111 where one silicon oxide plate was disposed accurately was counted. Furthermore, the number (N1) of the hydrophilic regions where a plurality of the silicon oxide plates were disposed was counted. The number (N2) of the hydrophilic regions where one silicon oxide plate was disposed in the distorted state was also counted. Nc denotes the sum of N1 and N2. See Table 1, which is described later.

Examples 2-5 and Comparative Examples 1-6

In order to determine the preferable value of $D1/D2$, examples 2-5 and comparative examples 1-5 were performed.

Figure 9A:
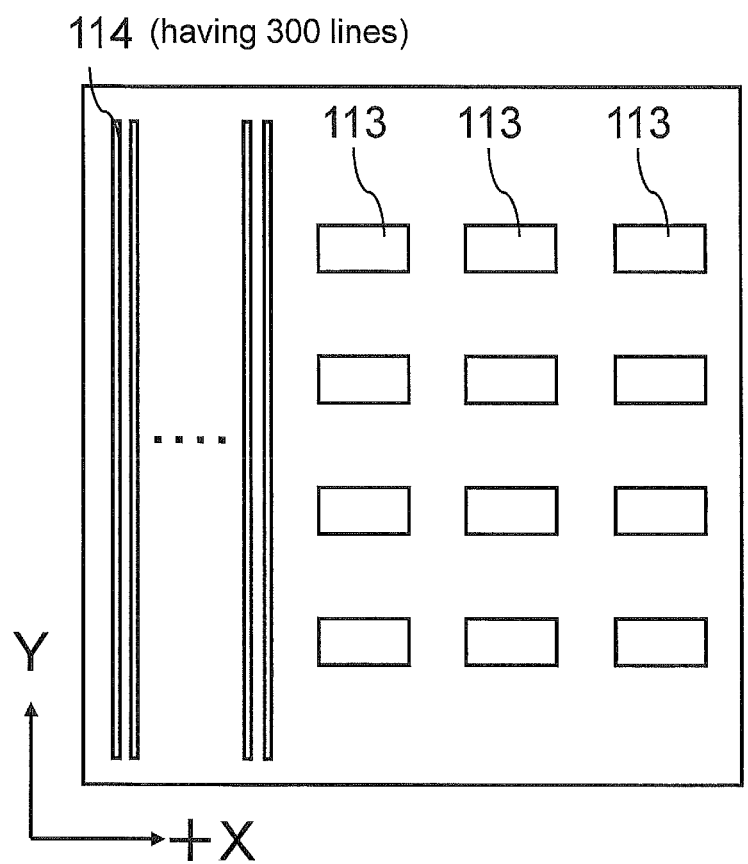
FIG. 9A shows a top view for describing a method for disposing a component according to the comparative example 5.

In examples 2-5 and comparative examples 1-4, experiments similar to that of example 1 were performed except that the hydrophilic body regions 111 and the hydrophilic lines 112 which have the values of D1 shown in Table 1 were formed. In comparative examples 5, an experiment similar to that of example 1 was performed in accordance with the method disclosed in U.S. Pat. No. 7,867,563 (See FIG. 9A. The referential mark 113 indicates the hydrophilic body regions. The referential mark 114 indicates the hydrophilic lines.). In comparative example 6, an experiment similar to that of example 1 was performed except that the hydrophilic lines 112 were not formed.

Table 1 shows the values of Np and Nc in examples 1-5 and comparative examples 1-6.

TABLE 1

| | D1/D2 | D1 | D2 (micrometer) | D3 (micrometer) | D5 (micrometer) | Np | Nc | Nc/Np |
|---|---|---|---|---|---|---|---|---|
| Example 1 | 0.10 | 2 | 20 | 20 | 100 | 20 | 2 | 0.10 |
| Example 2 | 0.20 | 4 | 20 | 20 | 100 | 25 | 4 | 0.16 |
| Example 3 | 0.40 | 8 | 20 | 20 | 100 | 28 | 4 | 0.14 |
| Example 4 | 0.80 | 16 | 20 | 20 | 100 | 23 | 3 | 0.13 |
| Example 5 | 1.20 | 24 | 20 | 20 | 100 | 22 | 3 | 0.14 |
| Comparative Example 1 | 0.05 | 1 | 20 | 20 | 100 | 12 | 2 | 0.17 |
| Comparative Example 2 | 1.60 | 32 | 20 | 20 | 100 | 10 | 5 | 0.50 |
| Comparative Example 3 | 2.00 | 40 | 20 | 20 | 100 | 11 | 2 | 0.18 |
| Comparative Example 4 | 2.40 | 48 | 20 | 20 | 100 | 12 | 3 | 0.25 |
| Comparative Example 5 | The hydrophilic lines 112 were formed at the side of one end of the substrate. The number of the hydrophilic lines 112 was 300. | | | | | 15 | 3 | 0.20 |
| Comparative Example 6 | not formed | | | | | 11 | 2 | 0.18 |

As shown in Table 1, the values of Np according to examples 1-5 were 20-28.

On the contrary, the values of Np according to comparative examples 1-6 were 10-15. This means that the probability that the components 400 is disposed on the hydrophilic body regions 111 is increased when the hydrophilic line 112 is provided and when the value of D1/D2 is not less than 0.10 and not more than 1.20.

Examples 6-21 and Comparative Examples 7-15

Figure 9B:
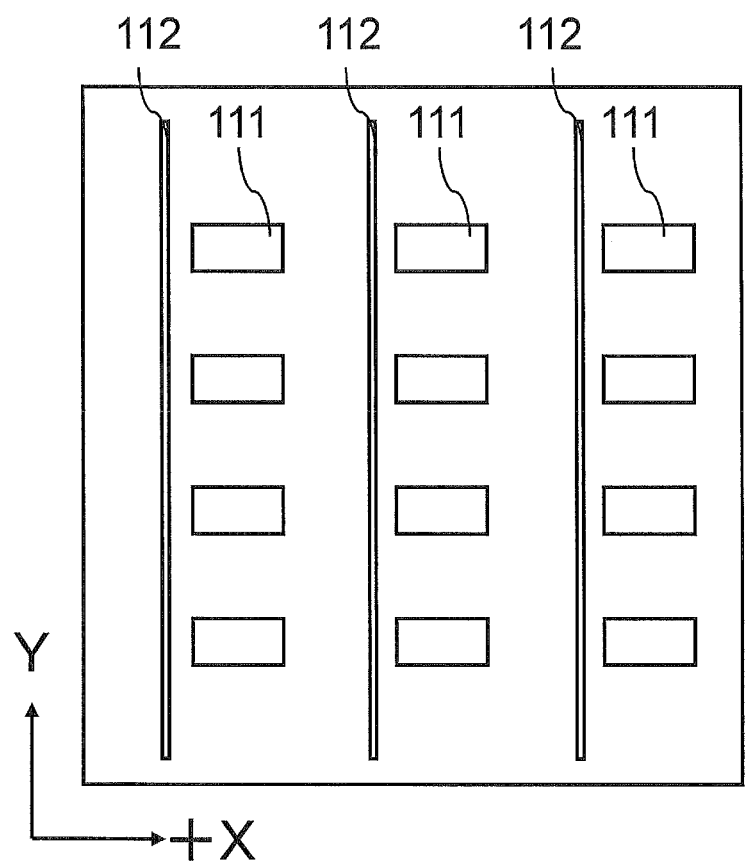
FIG. 9B shows a top view for describing a method for disposing a component according to the comparative example 11.
Figure 10A:
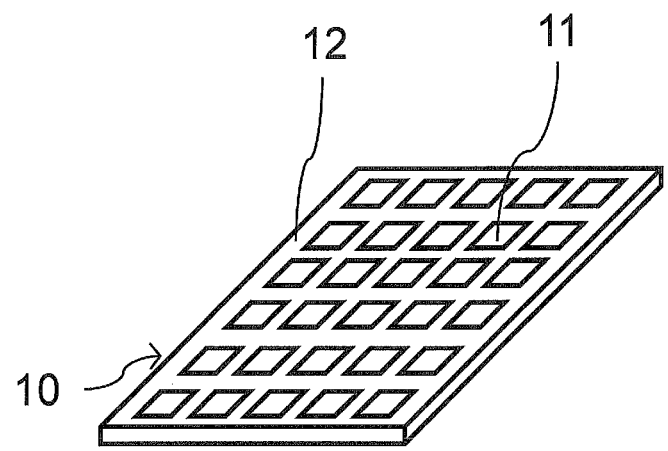
FIGS. 10A-10D show the method disclosed in U.S. Pat. No. 7,730,610.
Figure 10B:
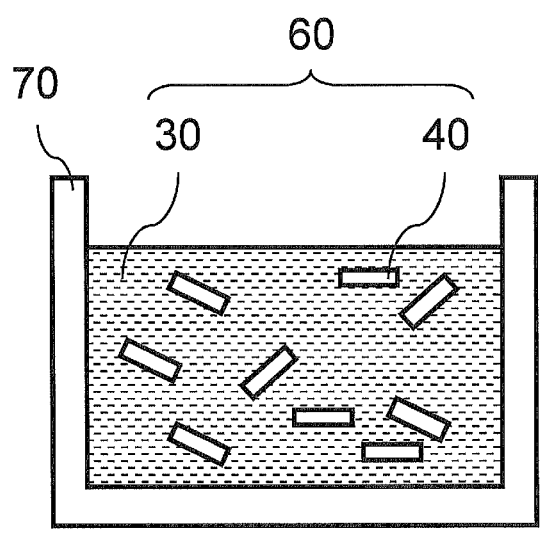
Figure 10C:
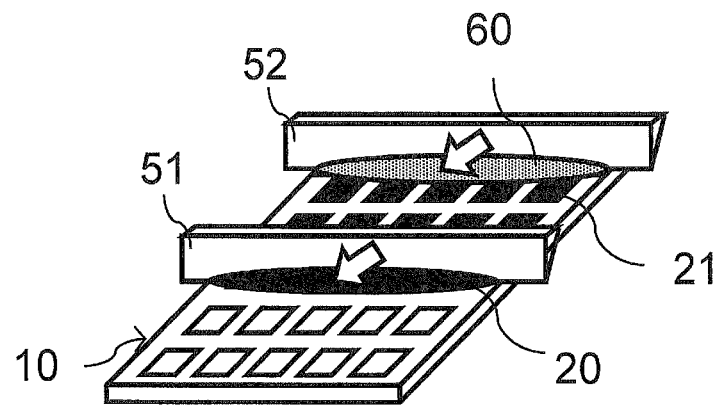
Figure 10D:
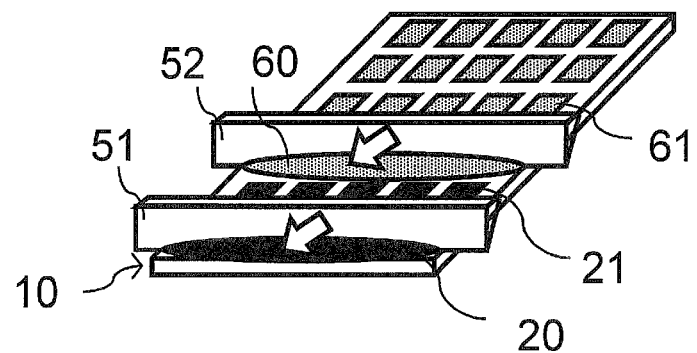

In order to determine the preferable values of D3 and D5, examples 6-21 and comparative examples 7-15 were performed. In examples 6-21 and comparative examples 7-15, experiments similar to that of example 1 were performed except that the hydrophilic body regions 111 and the hydrophilic lines 112 which have the values of D1-D5 shown in Table 2 were formed. In comparative example 11, as shown in FIG. 9B, the value of D5 was 0.

TABLE 2

| | D1/D2 | D1 | D2 (micrometer) | D3 (micrometer) | D5 (micrometer) | Np | Nc | Nc/Np |
|---|---|---|---|---|---|---|---|---|
| Example 6 | 0.10 | 2 | 20 | 5 | 115 | 20 | 2 | 0.10 |
| Example 7 | 0.10 | 2 | 20 | 50 | 70 | 21 | 3 | 0.14 |
| Example 8 | 0.10 | 2 | 20 | 100 | 20 | 22 | 2 | 0.09 |
| Example 9 | 0.10 | 2 | 20 | 110 | 10 | 22 | 1 | 0.05 |
| Example 10 | 0.40 | 8 | 20 | 5 | 115 | 22 | 3 | 0.14 |
| Example 11 | 0.40 | 8 | 20 | 50 | 70 | 24 | 2 | 0.08 |
| Example 12 | 0.40 | 8 | 20 | 100 | 20 | 23 | 4 | 0.17 |
| Example 13 | 0.40 | 8 | 20 | 110 | 10 | 22 | 3 | 0.14 |
| Example 14 | 0.80 | 16 | 20 | 5 | 115 | 21 | 3 | 0.14 |
| Example 15 | 0.80 | 16 | 20 | 50 | 70 | 20 | 4 | 0.20 |
| Example 16 | 0.80 | 16 | 20 | 100 | 20 | 21 | 2 | 0.10 |
| Example 17 | 0.80 | 16 | 20 | 110 | 10 | 25 | 2 | 0.08 |
| Example 18 | 1.20 | 24 | 20 | 5 | 115 | 24 | 2 | 0.08 |
| Example 19 | 1.20 | 24 | 20 | 50 | 70 | 23 | 4 | 0.17 |
| Example 20 | 1.20 | 24 | 20 | 100 | 20 | 22 | 3 | 0.14 |
| Example 21 | 1.20 | 24 | 20 | 110 | 10 | 22 | 2 | 0.09 |
| Comparative Example 7 | 0.10 | 2 | 20 | 2 | 118 | 10 | 1 | 0.10 |
| Comparative Example 8 | 0.40 | 8 | 20 | 2 | 118 | 8 | 1 | 0.13 |
| Comparative Example 9 | 0.80 | 16 | 20 | 2 | 118 | 12 | 2 | 0.17 |
| Comparative Example 10 | 1.20 | 24 | 20 | 2 | 118 | 12 | 2 | 0.17 |
| Comparative Example 11 | 1.20 | 24 | 20 | — | 0 | 14 | 2 | 0.14 |
| Comparative Example 12 | 0.05 | 1 | 20 | 50 | 70 | 11 | 4 | 0.36 |
| Comparative Example 13 | 1.60 | 32 | 20 | 50 | 70 | 11 | 2 | 0.18 |
| Comparative Example 14 | 0.05 | 1 | 20 | 100 | 20 | 12 | 2 | 0.17 |
| Comparative Example 15 | 1.60 | 32 | 20 | 100 | 20 | 13 | 4 | 0.31 |

As shown in Table 2, the values of Np according to example 6-21 were 20-25.

On the contrary, the values of Np according to comparative examples 7-15 were 8-14. This means that the probability that the components 400 is disposed on the hydrophilic body regions 111 is increased when D3 is not less than 5 micrometers, and when D5 is not less than 10 micrometers, and when the value of D1/D2 is not less than 0.10 and not more than 1.20.

INDUSTRIAL APPLICABILITY

A component disposing method according to the present disclosure can be applied when components including electronic devices are disposed or columnar micro components are disposed. This method can be applied to methods of fabricating electronic equipment and electronic devices. For example, this method can be applied to methods of fabricating circuit boards and electronic equipment including the circuit boards, and methods of repairing circuit boards and electronic equipment including the circuit boards.

What is claimed is:

1. A method for disposing a component on a substrate, the method comprising:
    a step (a) of preparing the substrate, a first liquid, and a component-dispersing liquid; wherein:
        the substrate comprises a water-repellant region and a plurality of hydrophilic regions,
        the water-repellant region surrounds the plurality of hydrophilic regions;
        each of the hydrophilic regions comprises a hydrophilic body region and a hydrophilic line,
        the hydrophilic lines are arranged parallel to one another,
        where Y direction denotes the parallel direction of the hydrophilic line, Z direction denotes the normal line of the substrate, +X direction denotes the direction orthogonal to both of the Y direction and the Z direction, −X direction denotes the reverse direction of the +X direction,
        the plurality of hydrophilic regions are arranged along the +X direction and along the Y direction,
        the hydrophilic line and the hydrophilic body region included in each of the hydrophilic region are arranged along +X direction in this order,
        the hydrophilic body regions and the hydrophilic lines are arranged along the +X direction alternately,
        where D1 denotes the interval along the +X direction between the hydrophilic body region and the hydrophilic line included in each of the hydrophilic region, D2 denotes the length along the Y direction of the hydrophilic body region, D3 denotes the length along the Y direction of the hydrophilic line, D4 denotes the width of the hydrophilic line, D5 denotes the interval between two adjacent hydrophilic lines arranged along Y direction,
        a value of D1/D2 is not less than 0.1 and not more than 1.2,
        a value of D3 is not less than 5 micrometers,
        a value of D4 is less than the minimum length of the component,
        a value of D5 is not less than 10 micrometers,
        the first liquid is hydrophilic,
        the component-dispersing liquid containing the component and a second liquid,
        the second liquid is insoluble in the first liquid, and
        the component has a hydrophilic surface,
    a step (b) of applying the first liquid to the substrate along the +X direction continuously to dispose the first liquid on the hydrophilic lines and the hydrophilic body regions along the +X direction alternately;
    a step (c) of bringing the component-dispersing liquid in contact with the first liquid disposed on the hydrophilic region; and
    a step (d) of removing the first liquid and the second liquid from the substrate to dispose the component on the hydrophilic region.

2. The method according to claim 1, wherein
in the step (b), while the first liquid is applied to the substrate continuously with use of a first squeeze, the first squeeze is moved along the +X direction.

3. The method according to claim 2, wherein
in the step (b), the substrate is moved along the −X direction.

4. The method according to claim 1, wherein
in the step (b), while the first liquid is applied to the substrate continuously with use of a first squeeze, the substrate is moved along the −X direction.

5. The method according to claim 1, wherein
the first liquid is water.

* * * * *